United States Patent [19]

Hironaka et al.

[11] Patent Number: 5,336,546
[45] Date of Patent: Aug. 9, 1994

[54] ORGANIC ELECTROLUMINESCENCE DEVICE

[75] Inventors: Yoshio Hironaka; Hiroshi Tokailin; Chishio Hosokawa; Tadashi Kusumoto, all of Sodegaura, Japan

[73] Assignee: Idemitsu Kosan Co., Ltd., Tokyo, Japan

[21] Appl. No.: 971,817

[22] PCT Filed: Jul. 2, 1992

[86] PCT No.: PCT/JP92/00835

§ 371 Date: Feb. 3, 1993

§ 102(e) Date: Feb. 3, 1993

[87] PCT Pub. No.: WO93/01252

PCT Pub. Date: Jan. 21, 1993

[30] Foreign Application Priority Data

Jul. 12, 1991 [JP] Japan .................. 3-172090

[51] Int. Cl.$^5$ .................................. B32B 9/00
[52] U.S. Cl. .................... 428/209; 428/460; 428/690; 428/917; 313/503; 313/504
[58] Field of Search ............. 548/136, 145; 313/504, 313/505, 506, 503; 428/209, 690, 917, 691, 216, 460; 252/301.16, 301.24, 301.28, 301.31, 301.21

[56] References Cited

U.S. PATENT DOCUMENTS

| | | | |
|---|---|---|---|
| 2,765,304 | 5/1952 | Siegrist et al. | 548/145 |
| 3,189,447 | 6/1965 | Nengeboner et al. | 548/145 |
| 3,300,509 | 1/1967 | Weber | 548/145 |
| 3,481,949 | 12/1969 | Lynch et al. | 548/145 |
| 3,511,834 | 5/1971 | Siegrist et al. | 548/145 |
| 3,600,383 | 8/1971 | Atkinson et al. | 548/145 |
| 3,903,101 | 9/1975 | Yoshida et al. | 548/145 |
| 3,995,299 | 11/1976 | Partridge | 313/504 |
| 4,127,412 | 11/1978 | Rule et al. | 96/1 |
| 4,720,432 | 1/1988 | VanSlyke et al. | 428/457 |
| 4,769,292 | 9/1988 | Tang et al. | 428/690 |
| 4,950,950 | 8/1990 | Perry et al. | 313/504 |
| 5,085,947 | 2/1992 | Saito et al. | 428/690 |
| 5,121,029 | 6/1992 | Hosokawa et al. | 313/504 |
| 5,126,214 | 6/1992 | Tokailin et al. | 428/690 |
| 5,130,603 | 7/1992 | Tokailin et al. | 313/504 |

FOREIGN PATENT DOCUMENTS 2-216791 8/1990 Japan .
3-176993 7/1991 Japan .
691478 10/1979 U.S.S.R. .

OTHER PUBLICATIONS

Database Inspec, Institute of Electrical Engineers, Stevenage, GB, Inspec No. 4211992, Hamada Y et al "Organic Electroluminescent Devices with Bright Blue Emission", abstract of Optoelectron., Devices Technol. (Japan), Optoelectronics–Devices and Technologies, Jun. 1992, Japan, 7, 1, 83–93 ISSN 0912-5434.
Streitwieser and Heathcock, Introduction to Organic Chemistry, 3rd ed., 1985, pp. 1104–1106.

Primary Examiner—Patrick J. Ryan
Assistant Examiner—Patrick Jewik
Attorney, Agent, or Firm—Frishauf, Holtz, Goodman & Woodward

[57] ABSTRACT

An organic electroluminescence device including an oxadiazole or thiadiazole compound interposed between two electrons. The compound is of the formula

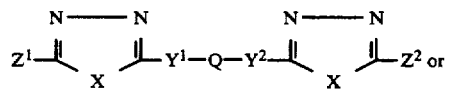

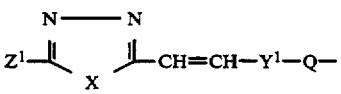

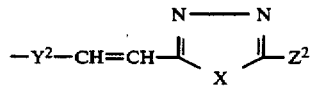

wherein $Z^1$ and $Z^2$ are each an unsubstituted or substituted aromatic group; $Y^1$ and $Y^2$ are each an unsubstituted or substituted aromatic group; Q is —O—, —CH$_2$—, —CH$_2$—CH$_2$—; or —C(CH$_3$)$_2$; and X is —O— or —S—. The organic electroluminescence device has a high brightness, a high luminous efficiency and a long service life.

20 Claims, No Drawings

ORGANIC ELECTROLUMINESCENCE DEVICE

DESCRIPTION

1. Technical Field

The present invention relates to an organic electroluminescence device. More particularly, it relates to an organic electroluminescence device wherein high brightness, high luminous efficiency and long lifetime can be attained by using an oxadiazole or a thiadiazole compound as a component of an organic electroluminescence device.

2. Background Art

As an organic electroluminescence device (hereinafter referred to as an organic EL device), the one described in the specification of U.S. Pat. No. 3,995,299 has heretofore been known. The structure of said organic EL device is anode/positive hole injecting layer/-polymer/electron injecting layer/cathode. The concept of positive hole injection layer' was first proposed therein. In this case, as a representative example of a polymer used as a light emitting layer was polyvinylcarbazole. The positive hole (hereinafter referred to as "hole") injecting layer works as an electric conducting layer in which cations exist, formed by adding a strong electron-accepting compound to the above polymer. Said hole injecting layer can inject holes to the above polymer in an applied electric field.

The electron injecting layer is an electric conducting layer in which anions exist, formed by adding a strong electron-donating compound. Said electron injecting layer can inject electrons to the above polymer in an applied electric field.

Moreover, according to E. H. Partridge, Polymer, 24,748 (1983), a hole injecting layer and an electron injecting layer are disclosed in detail, and it is shown that electrons and holes can be injected to an organic insulator by the above layers at lower voltages.

According to the above process, however, as a strong electron-donating compound, a metal such as Ce, which is readily oxidized, is used, so stable light emission could not always be obtained. Besides, since an oxidant such as $AlCl_3$ is used as an electron-accepting compound, stable light emitting action could not be obtained because of mobile ions such as $AlCl_4^-$ in an higher electric field.

On the other hand, the specification of U.S. Pat. No. 4,720,432 (Japanese Patent Application Laid-Open No. 295695/1988) discloses a device which has a structure as anode/hole injecting zone/hole transporting zone/electron transporting zone/cathode, and which uses a porphyrin compound for a hole injecting zone and a triphenylamine derivative for a hole transporting zone. In the device, the electron transporting zone is a light emitting zone, in which a 3-coordination 8-hydroxyquinoline complex such as a metal chelate oxanoide compound is used. The use of said device can make its lifetime several hundred hours longer, but enough lifetime cannot yet be obtained. This is because a triphenylamine derivative as the material for hole injecting is readily oxidized and also is weak in heat generation during the light emission.

Moreover, according to the specification of U.S. Pat. No. 4,950,950, the lifetime of the device was improved by using a silazane derivative in place of the above triphenylamine derivative. The brightness of the device after about 200-hour running is maintained to 80% of 140 $cd/m^2$ of its initial brightness, which is still insufficient performance.

In the prior arts described above, the electron transporting layer is a light emitting layer, but the combination of the device constituting elements defines the function of each layer.

Various structures of device are possible, but a device having a structure of anode/hole injecting layer/light emitting layer/electron injecting layer/cathode will be explained as an example.

It is considered that putting an electron injecting layer in the device structure promotes electrons to flow from the cathode to the light emitting layer, and the electrons recombine with most of the holes injected to the light emitting layer, resulting in higher luminous efficiency. Moreover, when an energy barrier exists between the light emitting layer and the electron injecting layer, the injected holes are enclosed in the light emitting layer, resulting in higher probability of recombining with the electrons.

The organic compound applicable to an electron injecting layer requires the following conditions with respect to the durability of the light emitting device.

1. No chemical deterioration due to excited states.
2. No deterioration due to generation of heat (having heat resistance).
3. Easy high purification to prevent dielectric breakdown by impurities.
4. No reaction with electrodes nor denaturation by an electrochemical reaction with moisture or oxygen in the air, with electrodes being catalyst.
5. Microcrystalline or amorphous material of an ability to form thin film in order to give a thin film free from pinholes, for the film thickness of each layer of an organic thin film electroluminescence device is not more than 100 nm or so.
6. Good adhesion to a cathode metal.
7. No reduction in luminous efficiency because of mutual interaction in the interface of the light emitting layer (of importance to obtain emission of blue light).

Examples of the compounds heretofore used as electron injecting layers are:

(a) nitro-substituted fluorenone derivative such as

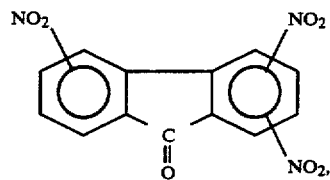

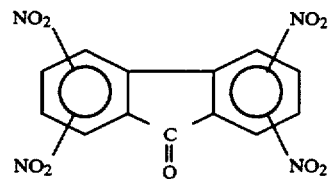

(b) anthraquinodimethane derivatives described in Japanese Patent Application Laid-Open Nos. 149259/1982, 55450/1983, 104061/1988, etc., (c) diphenylquinone derivatives such as

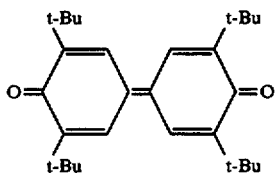

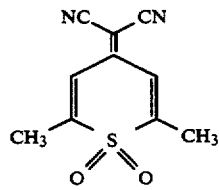

(e) compounds represented by

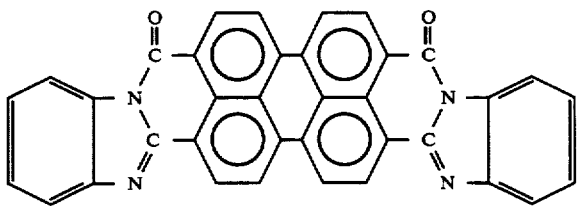

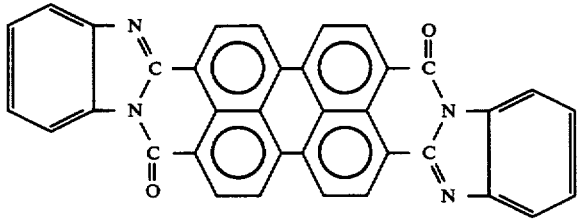

described in J. Appl. Phys., 27, L269 (1988), etc., and (f) compounds represented by

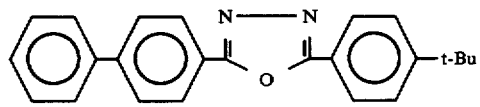

(t-Bu: tert-butyl)

described in Appl. Phys. Lett., Vol. 55 (1989), p. 1489, etc.

The compounds (a) to (d), however, have a disadvantage in that the lifetime of a light emitting device is short. Since the compound (e) has no barrier to holes, light emission sometimes occur in the electron injecting layer, causing decrease in luminous efficiency.

Moreover, the device using the compound (f) can realize a higher luminous efficiency, but has a disadvantage of short lifetime because of its low melting point (136° to 138° C.) and its crystallinity.

In addition, the following new oxadiazole derivatives are disclosed in Japanese Patent Application Laid-Open Nos. 350831/1991 and 35084/1991.

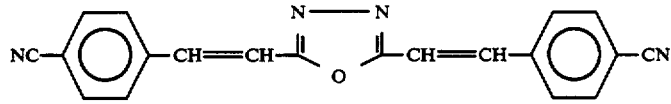

Examples of said oxadiazole derivative as a light emitting material are represented by the formula:

wherein $Ar^1$ and $Ar^2$ are

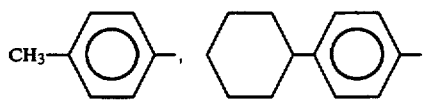

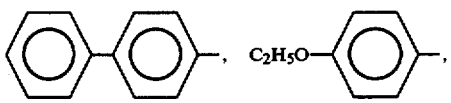

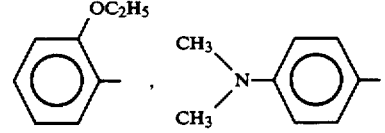

and examples of it as an electron injecting layer are represented by the formula:

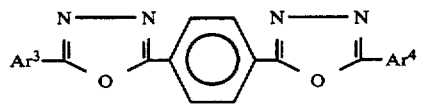

(wherein $Ar^3$ and $Ar^4$ are

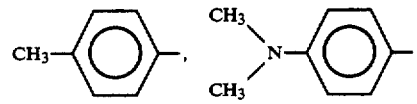

(Appl. Phys. Associates, Spring, Preprints, p. 1086 (1991)). However, both have a disadvantage of formation of exciplex or short lifetime of about 10 hours in spite of a light emission with high brightness.

Moreover, application of an electrical charge for a long time causes peeling-off between electrodes and organic layers, or crystallization and milky turbidity of organic layers and electrodes. Such peeling off or crystallization must be prevented.

Therefore, the present inventors have made intensive researches to solve the above problems.

DISCLOSURE OF THE INVENTION

As a result, it has been found that the above problems can be overcome by using a specific oxadiazole or thiadiazole compound as an organic EL device component. The present invention has been accomplished on the basis of such knowledge.

That is, the present invention provides an organic EL device containing a compound represented by the general formula (I):

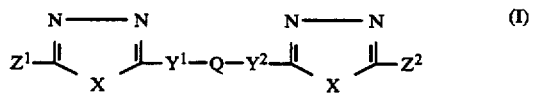

(wherein $Z^1$ and $Z^2$ are each an unsubstituted aromatic group or an aromatic group having $C_{1-5}$ alkyl groups, $C_{1-5}$ alkyloxy groups, cyano groups, chlorines, bromines or fluorines; $Y^1$ and $Y^2$ are each an unsubstituted aromatic group or an aromatic group having $C_{1-5}$ alkyl groups; Q is $-O-$, $-CH_2-$, $-CH_2-CH_2-$, or $-C(CH_3)_2-$; and X is $-O-$ or $-S-$).

The present invention also provides an organic EL device containing a compound represented by the general formula (I'):

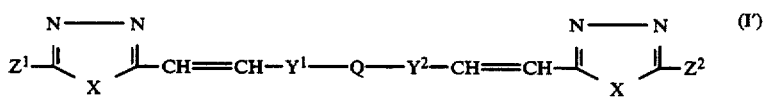

(wherein each symbol is as defined above).

Moreover, the present invention provides an organic EL device in which a compound of the above general formula (I) or (I') is sandwiched between a pair of electrodes, and an organic EL device in which an electron injecting layer comprises a compound of the above general formula (I) or (I').

THE MOST PREFERRED EMBODIMENT TO CARRY OUT THE INVENTION

The aromatic groups represented by $Z^1$ and $Z^2$ of the general formulas (I) and (I') of the present invention include:

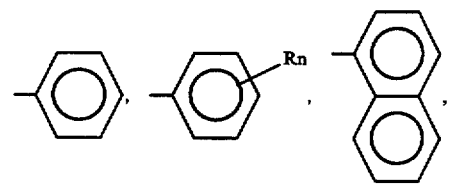

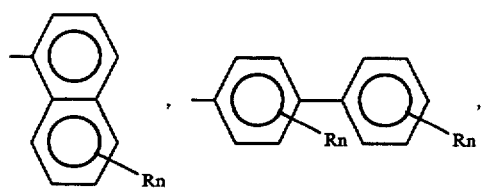

-continued

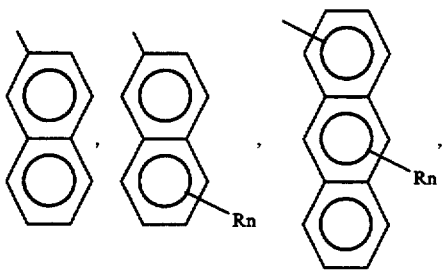

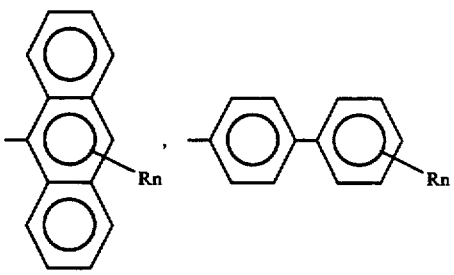

The substituents represented by R include an alkyl group having 1 to 5 carbon atoms such as a methyl group, an ethyl group, an n-propyl group, an i-propyl group, an n-butyl group, an i-butyl group, a sec-butyl group, a tert-butyl group, an isopentyl group, a t-pentyl group, a neopentyl group and a cyano group, an alkyloxy group having 1 to 5 carbon atoms (a methoxy group, an ethoxy group, an n-propoxy group, an i-propoxy group, an n-butoxy group, an i-butoxy group, a sec-butoxy group, a tert-butoxy group, an isopentoxy group, and a neopentoxy group), chlorine, bromine, fluorine, etc., and n is an integer of 1 to 5.

The aromatic groups represented by $Y^1$ and $Y^2$ include:

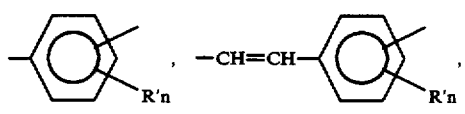

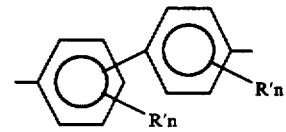

The alkyl group as a substituent represented by R' is the same as in the case of $Z^1$ and $Z^2$, and n is an integer of 1 to 4.

The oxadiazole compounds represented by the general formula (I) or (I') of the present invention are various and are not limited, but include, for example, 4,4'-bis(5-(p-diphenyl)-1,3,4-oxadiazole-2-yl)diphenylether, 4,4'-bis(5-(p-diphenyl)-1,3,4-oxadiazole-2-yl)diphenylether, 4,4'-bis(5(4-tert-butylphenyl)-1,3,4-oxadiazole-2-yl)diphenylether, 4,4'-bis[2-(5-(p-diphenyl)-1,3,4-oxadiazole-2-yl)vinyl]diphenylether, 4,4'-bis[2-(5-phenyl-1,3,4-oxadiazole-2-yl)vinyl]diphenylether, 4,4'-bis(5-(4-tert-butylphenyl)-1,3,4-oxadiazole-2-yl)diphenylether, 4,4'-bis(5-(1-naphthyl)-1,3,4-oxadiazole-2-yl)diphenylmethane, 4,4'-bis[5-(2-naphthyl)-1,3,4-oxadiazole-2-yl]diphenylether, 4,4'-bis[5-(4-cyanophenyl)-1,3,4-oxadiazole-2-yl]diphenylether, 1,1'-oxybis[p-(5-phenyl-1,3,4-oxadiazole-2-yl)diphenyl], 1,1'-oxybis[p-(5-(4-tert-butylphenyl)-1,3,4-oxadiazole-2-yl)diphenyl], 1,1'-oxybis[p-(5-(p-diphenyl)-1,3,4-oxadiazole-2-yl)diphenyl], 1,1'-oxybis[p-(5-(1-napthyl)-,1,3,4-oxadiazole-2-yl)diphenyl], and 1,1'-oxybis[p-(5-(2-naphthyl)-1,3,4-oxadiazole-2-yl)dipheny].

The thiadiazole compounds represented by the general formula (I) or (I') of the present invention are various and are not limited, but include, for example, 4,4'-bis(5-phenyl1,3,4-thiadiazole-2-yl)diphenylether, 4,4'-bis[5-(p-diphenyl)1,3,4-thiadiazole-2-yl]diphenylether, 4,4'-bis[5-(4-tert-butylphenyl)-1,3,4-thiadiazole-2-yl]diphenylether, 4,4'-bis[5-(4-cyanophenyl)-1,3,4-thiadiazole-2-yl]diphenylether, 4,4'-bis[5-(m-chlorophenyl)-1,3,4-thiadiazole-2-yl]diphenylether, 4,4'-bis[5-(p-methoxyphenyl)-1,3,4-thiadiazole-2 -yl]diphenylether, 4,4'-bis[5-(4-tert-butoxyphenyl)-1,3,4-thiadiazole-2-yl]diphenylether, 4,4'-bis[5-(1-naphthyl)-1,3,4-thiadiazole-2-yl]diphenylether, 4,4'-bis[5-(2-naphthyl)-1,3,4-thiadiazole-2-yl]diphenylether, 4,4'-bis[2-(5-phenyl-1,3,4-thiadiazole-2-yl)vinyl]diphenylether, 4,4'-bis[2-(5-(p-diphenyl)-1,3,4-thiadiazole-2-yl)vinyl]diphenylether, 1,1'-oxybis[p-(5-(4-tert-butylphenyl)-1,3,4-thiadiazole-2-yl) diphenyl], 1,1'-oxybis[p-(5-(p-diphenyl)-1,3,4-thiadiazole-2-yl)diphenyl], and 1,1'-oxybis[p-(5-(1-naphthyl)-1,3,4-thiadiazole-2-yl)diphenyl].

The present invention provides an organic EL device containing a compound represented by the above general formula (I) or (I'), the structures of which include the types of anode/hole injecting layer/light emitting layer/electron injecting layer/cathode, anode/light emitting layer/electron injecting layer/cathode, anode/hole injecting layer/light emitting layer/cathode, and anode/light emitting layer/cathode. The compound represented by the general formula (I) or (I') forms preferably a light emitting layer and an electron injecting layer. A hole injecting layer and an electron injecting layer are not necessary for forming device, but a device containing the above layers has an advantage of improving luminous performance. The above hole injecting layer, light emitting layer and electron injecting layer may be sandwiched in mixed form between a pair of electrodes. Moreover, a mixed layer may be prepared using a binder of polymer so that each component may exist stably.

As an example of the organic EL device of the present invention, a device having the structure of anode/hole injecting layer/light emitting layer/electron injecting layer/cathode will be explained.

The device of the present invention is preferably supported by a substrate. Said substrate is not particularly limited, and those conventionally used for an organic EL device, for example, those consisting of glass, transparent plastic or quartz can be used, As an anode in said EL device, those using a metal, an alloy, an electric conducting compound or a mixture thereof, all having a large work function (not less than 4 eV), as the electrode material can preferably be used. Specific examples of such electrode materials are a metal such as Au, and an electroconducting transparent material such as CuI, ITO, SnO$_2$, and ZnO. Said anode can be prepared by forming said electrode material into thin film by the vapor deposition method or by sputtering. To obtain light emission from said electrode, it is preferable that the transmittance be more than 10% and the resistance of the sheet as an electrode be not more than several hundred $\Omega/\square$.

The film thickness is usually selected in the range of 10 nm to 1 μm, preferably 10 to 200 nm, depending upon the material.

On the other hand, as a cathode, those using a metal, an alloy, an electric conducting compound or a mixture thereof, all having a small work function (not more than 4 eV), as an electrode material can preferably be used. Specific examples of such electrode materials are sodium, a sodium-potassium alloy, magnesium, lithium, a magnesium-copper mixture, Al/Al$_2$O$_3$, and indium. Said cathode can be prepared by forming said electrode material into thin film by the vapor deposition method or by sputtering. The resistance of the sheet as an electrode is preferably not more than several hundred $\Omega/\square$. The film thickness is usually selected in the range of 10 to 500 nm, preferably 50 to 200 nm. To transmit light emission, either anode or cathode of the organic EL device is favorably transparent or translucent, as luminous efficiency is improved.

As a luminescent material for a light emitting layer of the present invention, an oxadiazole compound or thiadiazole compound represented by the above general formula (I) or (I') is preferable. When said oxadiazole or thiadiazole compound is used for other than the light emitting layer, the luminescent material for a light emitting layer is not particularly limited, and any one selected from the conventionally known compounds can be used.

As a luminescent material, a compound of a high ability to form a thin film, such as a polycyclic condensation aromatic compound, a benzoxazole, benzothiazole or benzimidazole fluorescent brightening agent, a metal chelation oxanoid compound and a distyryl benzene compound, can be used. As the above polycyclic condensation aromatic compound, a condensed ring luminescent substance including an anthracene, naphthalene, phenanthrene, pyrene, chrysene or perylene skeleton, and the other condensed ring luminescent substances having about 8 condensed rings, for instance, are given.

As the above benzoxazole, benzothiazole or benzimidazole fluorescent brightening agent, for example, that described in Japanese Patent Application Laid-Open No. 194393/1984 can be used. Typical examples are a benzoxazole fluorescent brightening agent such as 2,5-bis(5,7-di-t-pentyl-2-benzoxazolyl)-1,3,4-thiadiazole, 4,4'-bis(5,7-t-pentyl-2-benzoxazolyl)stilbene, 4,4'-bis(5,7-di-(2-methyl-2-butyl)-2-benzoxazolyl)-stilbene, 2,5-bis(5,7-di-t-pentyl-2-benzoxazolyl) thiophene, 2,5-bis(5-(α,α-dimethylbenzyl)-2-benzoxazolyl) thiophene, 2,5-bis(5,7-di-(2-methyl-2-butyl)-2-benzoxazolyl)-3,4-diphenylthiophene, 2,5-bis(5-methyl-2-benzoxazolyl) thiophene, 4,4'-bis(2-benzoxazolyl)biphenyl, 5-methyl-2-(2-(4-(5-methyl-2-benzoxazolyl)phenyl)-vinyl)benzoxazole, add 2-(2-(4-chlorophenyl)vinyl)-naphtho(1,2-d)oxazole; a benzothiazole fluorescent brightening agent such as 2,2'-(p-phenylenedivinylene)-bisbenzothiazole; and a benzimidazole fluorescent brightening agent such as 2-(2-(4-(2-benzoimidazolyl)-phenyl)vinyl)benzimidazole and 2-(2-(4-carboxyphenyl)vinyl)benzimidazole.

As the above metal chelation oxanoid compound, for example, those described in Japanese Patent Application Laid-Open No. 295695/1988 can be used. Typical examples are a 8-hydroxyquinoline metal complex such as tris(8-quinolinol) aluminum, bis(8-quinolinol)magnesium, bis(benzo(f)-8-quinolinol) zinc, bis(2-methyl-8-quinolinolate)aluminum oxide, tris(8 -quinolinol)indium, tris(5-methyl-8-quinolinol)aluminum, 8-quinolinol lithium, tris(5-chloro-8-quinolinol)gallium, bis(5-chloro-8-quinolinol)calcium, and poly(zinc(II)-bis(8-hydroxy-5-quinolinonyl)methane); and dilithiumepindridione.

In addition, distyryl benzene derivatives described in the specification of European Patent No. 0373582, dimethylidene derivatives described in the specification of European Patent No. 0388768, coumarin derivatives in Japanese Patent Application Laid-Open No. 191694/1990, distyrylpyrazine derivatives in Japanese Patent Application Laid-Open No. 52793/1990, perylene derivatives in Japanese Patent Application Laid-Open No. 196885/1990, naphthalene derivatives in Japanese Patent Application Laid-Open No. 255789/1990, phthaloperinone derivatives in Japanese Patent Application Laid-Open Nos. 289676/1990 and 88689/1990, styrylamine derivatives in Japanese Patent Application Laid-Open No. 250292/1990, and cyclopentadiene derivatives in Japanese Patent Application Laid-Open No. 289675/1990 can be used appropriately depending upon the desired emission light and performance.

The light emitting layer comprising the above organic compound may be a laminate comprising two or more layers, if desired, and may be formed with a luminescent substance added to it, as disclosed in the specification of U.S. Pat. No. 4,769,292. In such case, the above organic compound is in a form of a thin film layer, and has part of an injection and a light emission function of the light emitting zone, while the luminescent substance exists in the organic compound layer in a small amount (not more than several mol %), and has part of a light emission function of emitting light in response to recombination of electrons with holes.

Further, the organic compound to be used for a light emitting zone may be a compound having no ability to form a thin film. Examples of such compounds are 1,4-diphenyl-1,3butadiene, 1,1,4,4-tetraphenyl-1,3-butadiene and tetraphenylcyclopentadiene. However, such materials having no ability to form a thin film have the disadvantage of a short lifetime of the device.

The hole injecting layer in the organic EL device of the present invention comprises a hole transporting compound and has a function of transporting holes injected from the anode to the light emitting layer. By sandwiching said hole injecting layer between the anode and the light emitting layer, more holes are injected to the light emitting layer at lower electric field, and further electrons injected to the light emitting layer from the cathode or the electron injecting layer are accumulated in the interface in the light emitting layer due to the electron barrier existing in the interface between the light emitting layer and the hole injecting layer, resulting in making a device excellent in luminous performance such as improved luminous efficiency. The hole transporting compound to be used for the above hole injecting layer is placed between two electrodes where an electric field is applied, and can transport the holes, which are injected from the anode, to the light emitting layer properly. A preferable hole transporting compound has, for example, a hole mobility of at least $10^{-6}$ cm$^2$/V.sec when an electric field of $10^4$ to $10^6$ V/cm is applied.

Said hole transporting compound is not particularly limited, so long as it has preferable properties as described above, and any compound can be used, being selected from those used conventionally as a charge injecting and transporting material for holes in a photoconductive material, or the known ones in use for a hole injecting layer of an EL device.

As the above hole transporting compound, for example, triazole derivatives, oxadiazole derivatives (described in the specification of U.S. Pat. No. 3,189,447, etc., other than represented by the general formulas (I) and (I') in the present invention), imidazole derivatives, polyarylalkane derivatives, pyrazoline derivatives or pyrazolone derivatives, phenylenediamine derivatives, arylamine derivatives, aminosubstituted chalcone derivatives, oxazole derivatives, arylanthracene derivatives, fluorenone derivatives, hydrazone derivatives and stilbene derivatives are mentioned.

As a hole injecting and transporting material, silazane derivatives, polysilane copolymers, aniline copolymers, electroconducting oligomers, and especially thiophene oligomers are mentioned.

In the present invention, the above compound can be used as a hole injecting material, but it is preferable to use a porphyrin compound (described in Japanese Patent Application Laid-open No. 2956965/1988), an aromatic tertiary amine compound or a styrylamine compound (described in the specification of U.S. Pat. No. 4,127,412, and Japanese Patent Application Laid-Open Nos. 27033/1978, 58445/1979, 149634/1979, 64299/1979, 79450/1980, 144250/1980, 119132/1981, 295558/1986, 98353/1986 and 295695/1988), and said aromatic tertiary amine compound is most preferable.

Typical examples of said porphyrin compound are porphyrin; 1,10,15,20-tetraphenyl-21H,23H-porphyrin copper (II); 1,10,15,20-tetraphenyl-21H,23H-porphyrin zinc (II); 5,10,15,20-tetrakis(pentafluorophenyl)-21H,23H-porphyrin; silicon phthalocyanineoxide; aluminum phthalocyaninechloride; phthalocyanine (nonmetal); dilithium phthalocyanine; copper tetramethylphthalocyanine; copper phthalocyanine; chrome phthalocyanine; zinc phthalocyanine; lead phthalocyanine; titanium phthalocyanineoxide; magnesium phthalocyanine; and copper octamethylphthalocyanine.

Typical examples of said aromatic tertiary amine compound and styrylamine compound are N,N,N',N'-tetraphenyl-4,4'-diaminophenyl, N,N'-diphenyl-N,N'-di(3-methylphenyl)-4,4'-diaminobiphenyl (TPDA), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl) phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quadriphenyl, N,N,N-tri(p-tolyl)amine, 4-(di-p-tolylamino)-4'-[4(di-p-tolylamino)styryl]stilbene, 4 -N,N-diphenylamino-(2-diphenylvinyl)benzene, 3-methoxy-4'-N,N-diphenylamino-styrylbenzene, and N-phenylcarbazole.

Moreover, crystal or noncrystal materials for inorganic semiconductors such as Si, SiC and CdS can be used.

Said hole injecting layer may be made up of one layer comprising one, or two or more kinds of said hole injecting materials, or a laminate of a hole injecting layer comprising a different compound from that of the above hole injecting layer.

The electron injecting layer of the organic EL device to be used in the present invention comprises an electron injecting material, and has a function of transporting electrons injected from the cathode to the light emitting layer. In the present invention, the compound represented by the above general formula (I) or (I') is preferable. When said oxadiazole or thiadiazole compound is used for other than the electron injecting layer, the electron injecting material is not particularly limited, and any compound can be used, being selected from the conventional compounds.

The electron injecting layer in the organic EL device of the present invention can be prepared by forming a compound represented by the above general formula (I) or (I') into thin film by the known method of forming thin film such as the vapor deposition method, the spin-coating method, the casting method and the LB method. The film thickness of the electron injecting layer is not particularly limited, but usually 5 nm to 5 μm.

Said electron injecting layer may be made up of one layer comprising one, or two or more kinds of the above electron injecting materials, or a laminate of an electron injecting layer comprising a different compound from that of the above layer.

Moreover, the hole injecting material of inorganic p-type Si or p-type SiC and the electron injecting material of n-type α-Si or n-type α-SiC can be used as an electron injecting material. For example, inorganic semiconductors disclosed in International Application Laid-Open WO 90 05998 are mentioned.

Next, the preferable process for preparing an organic EL device of the present invention will be explained. For example, the EL device with the above-mentioned structure of anode/hole injecting layer/light emitting layer/electron injecting layer/cathode is prepared in the following manner. First, on the proper substrate, a thin film comprising the desired electrode material, for example, the material for an anode is formed in a thickness of not more than 1 μm, preferably in the range of 10 to 200 nm by the vapor deposition or by sputtering to prepare an anode. Then, on said anode, a thin film comprising device materials such as materials for a hole injecting layer, a light emitting layer and an electron injecting layer is formed.

As a method of producing thin film, as described above, the spin-coating method, the casting method and the vapor deposition method can be used. The vapor deposition method is preferable in that a uniform thin film can be obtained and pinholes are less likely to be formed. When said vapor deposition method is employed for producing thin film, the conditions of the vapor deposition vary depending upon the kind of the compound to be used, or the desired crystal structure and the association structure of the molecular accumulated film. Generally, it is preferable to select appropriately in the following ranges; a temperature for heating boat of 50° to 400° C., a pressure of $10^{-6}$ to $10^{-3}$ Pa, a vapor depositing rate of 0.01 to 50 nm/sec, a substrate temperature of $-50°$ to $+300°$ C., and a film thickness of 5 nm to 5 μm.

After forming said layers, a thin film comprising an electrode material for a cathode is formed thereon in a thickness of not more than 1 μm, preferably 50 to 200 nm, for example, by the vapor deposition method or by sputtering to prepare a cathode, whereupon the desired EL device can be obtained. Said EL device can also be prepared in reverse order, that is, in the order of a cathode, an electron injecting layer, a light emitting layer, a hole injecting and transporting layer and an anode.

Moreover, the device with the structure of anode/light emitting layer/cathode, in which a hole injecting layer, a light emitting layer and an electron injecting layer are sandwiched in mixed state between a pair of electrodes, is prepared in the following manner. For example, a thin film comprising an anode material is formed on the proper substrate, and coated with a solution comprising a hole injecting material, a light emitting material, an electron injecting material, and a binder such as polyvinylcarbazole, or the solution is formed into thin film by the immersion plating method to prepare a light emitting layer, on which a thin film comprising a cathode material is produced. In this case, on the prepared light emitting layer, a device material for the light emitting layer may be vapor deposited and a thin film comprising a cathode material may be formed thereon.

In applying a DC voltage to the EL device thus obtained, a DC voltage about 5 to 40 V is applied with an anode being polarity (+) and a cathode being polarity (−), whereupon light emission is observed. When a voltage is applied with the opposite polarity, no current yields, and no light emission is obtained. When AC voltage is applied, light emission is obtained only with an anode being (+) and a cathode being (−). Any wave form of AC voltage may be applied.

Herein, the process for preparing oxadiazole compounds and thiadiazole compounds represented by the general formulas (I) and (I') as a feature of the present invention will be explained briefly, though the process for synthesizing oxadiazole compounds and thiadiazoles compound to be used in the present invention is not limited to the following process.

To explain the process for synthesizing oxadiazoles, the following oxadiazole compounds A and B are taken as an example.

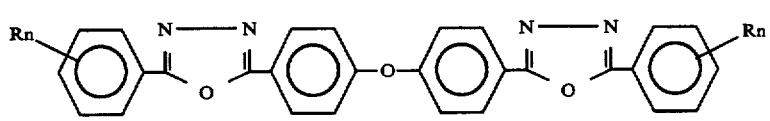

Oxadiazole Compound A

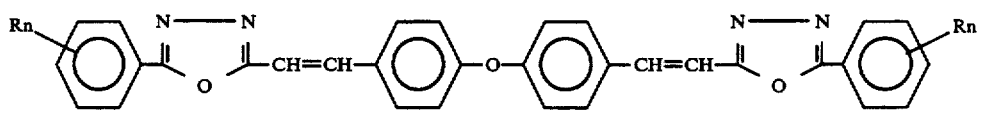

Oxadiazole Compound B (In the formulas, R is a hydrogen or an alkyl group having 1 to 5 carbon atoms, and n is an integer of 1 to 5.)

In the general formulas (I) and '(I') of the oxadiazole compounds A and B, Q, $Y^1$, $Y^2$, $Z^1$ and $Z^2$ are limited, but even if these are other than the limited ones, the reaction proceeds as well.

(1) Process 1 for Preparing Oxadiazole Compound A

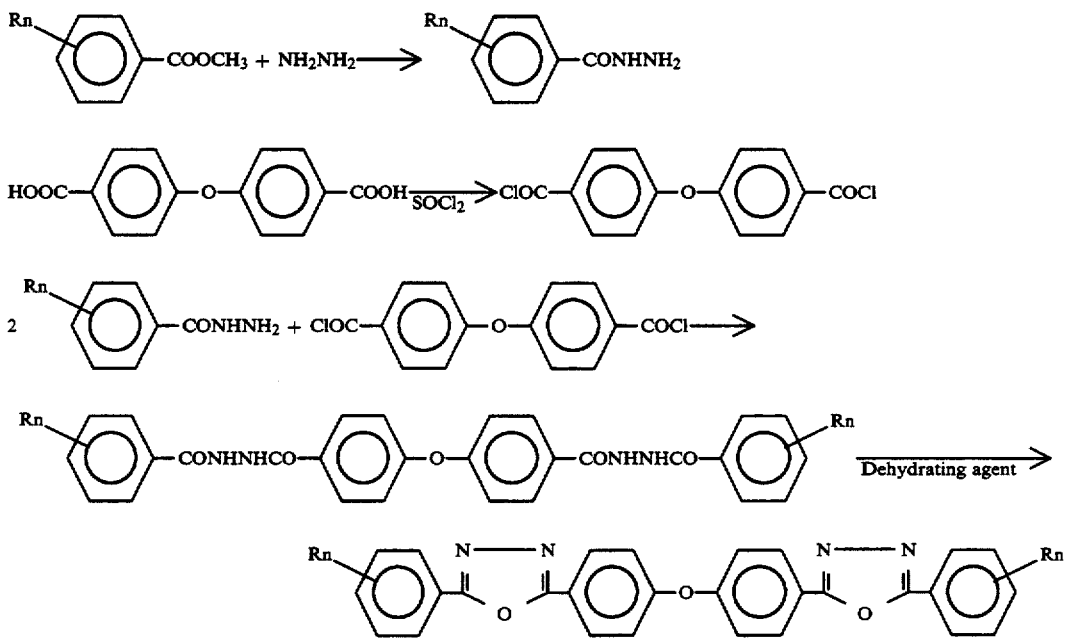

(2) Process 2 for Preparing Oxadiazole Compound A

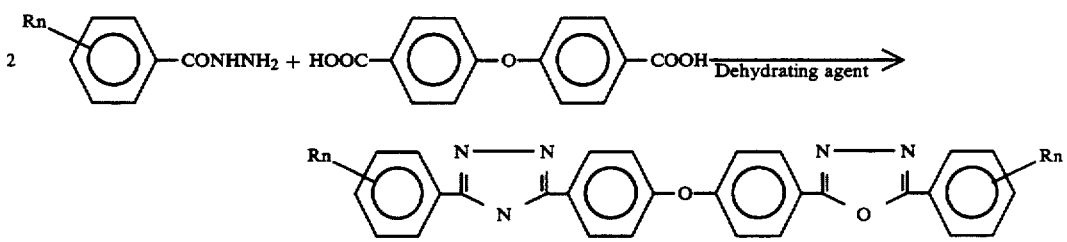

(3) Process 3 for Preparing Oxadiazole Compound A

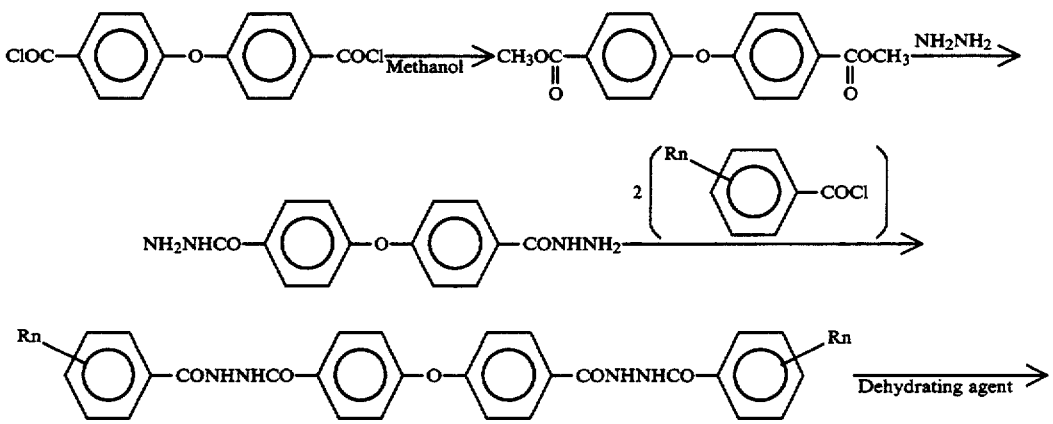

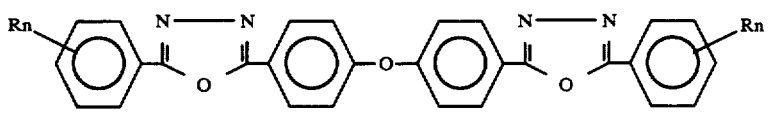

(4) Process 4 for Preparing Oxadiazole Compound A

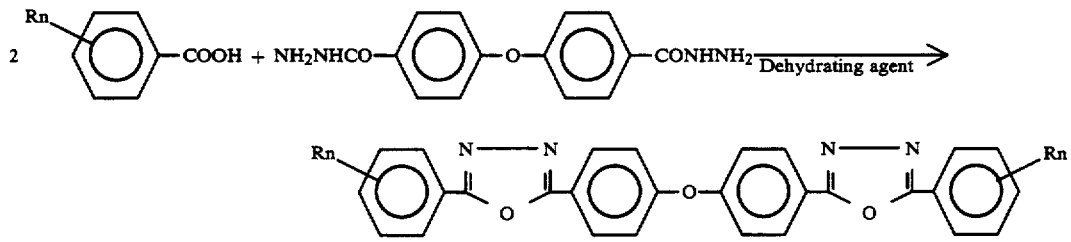

Dehydrating agents to be used for reaction in the above processes 1,2,3 and 4 for preparing oxadiazole compound A, include $POCl_3$, $SOCl_2$, polyphosphoric acid, phosphorus pentoxide methane-sulfonic acid (PPMA), and the like. The reaction temperature during dehydration is 60° to 220 ° C., preferably 70° to 180° C., and the reaction time is 1 to 20 hours (stirring).

(5) Process for Preparing Oxadiazole Compound B

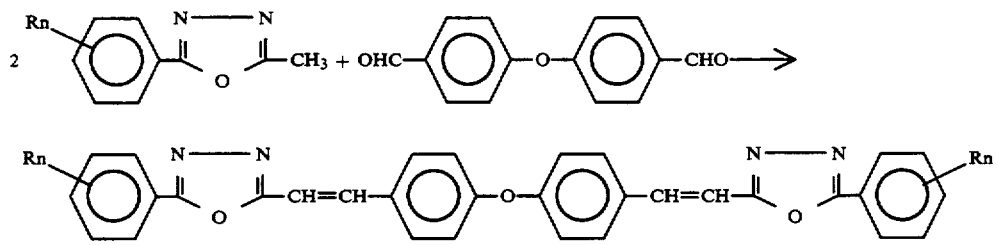

As a process for preparing oxadiazole compound B represented by the above chemical formula, for example, two processes as follows are given.

(i) To 2 mol parts of 2-methyloxadiazoles is added 2 mol parts of t-butoxypotassium under an inert atmosphere of argon, neon, helium or the like and the mixture is maintained at room temperature, followed by the addition of 1 mol part of 4,4'-diformyldiphenylether while stirring for 1 to 8 hours. The resultant is washed with water, filtered off again, dried, sublimed and purified (1 to $5 \times 10^{-5}$ mmHg, 150° to 350° C., 6 to 20 hours).

(ii) To 2 mol parts of 2-methyloxadiazoles, 1 mol part of 4,4'-diformyldiphenylether and DMSO (dimethylsulfoxide), an aqueous solution of 50% sodium hydroxide is added. The mixture is stirred for 1 to 8 hours, washed with distilled water and filtered off. The resulting residue is washed with methanol, filtered off again dried sublimed and purified (1 to $5 \times 10^{-5}$ mmHg, 150° to 350° C., 6 to 20 hours).

To explain the process for preparing thiaziazole, following thiadiazole compounds C and D are taken as an example.

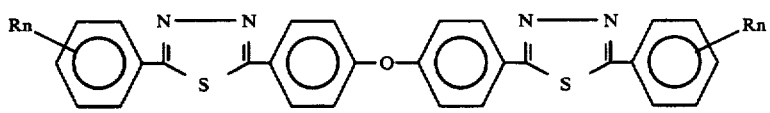

Thiadiazole Compound C

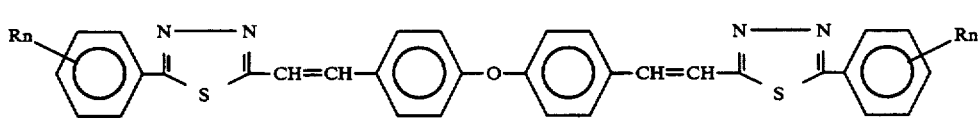

Thiadiazole Compound D (In the formulas, R is a hydrogen or an alkyl group having 1 to 5 carbon atoms, and n is an integer of 1 to 5.)

In thiadiazole compounds C and D, Q, $Y^1$, $Y^2$, $Z^1$ and $Z^2$ in the general formulas (I) and (I') are limited, but in other cases the reaction proceeds as well.

(1) Process 1 for Preparing Thiadiazole Compound C

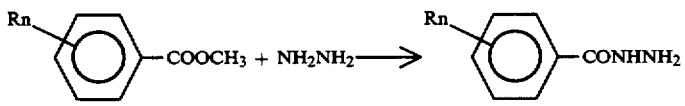

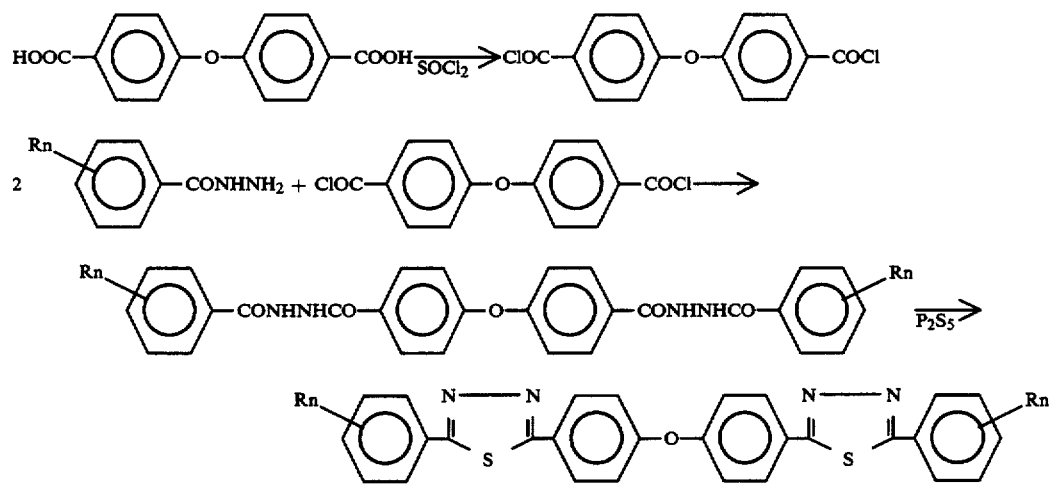

(2) Process 2 for Preparing Thiadiazole Compound C

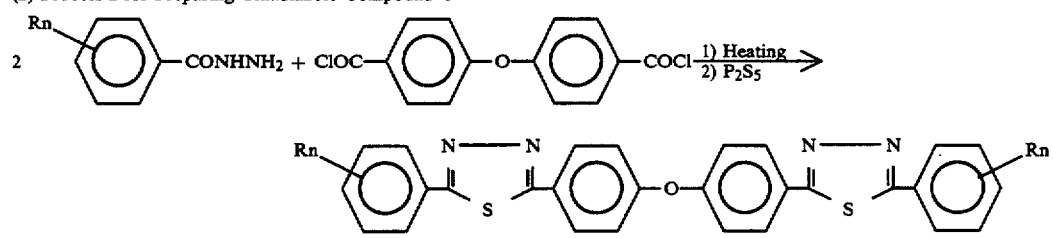

(3) Process 3 for Preparing Thiadiazole Compound C

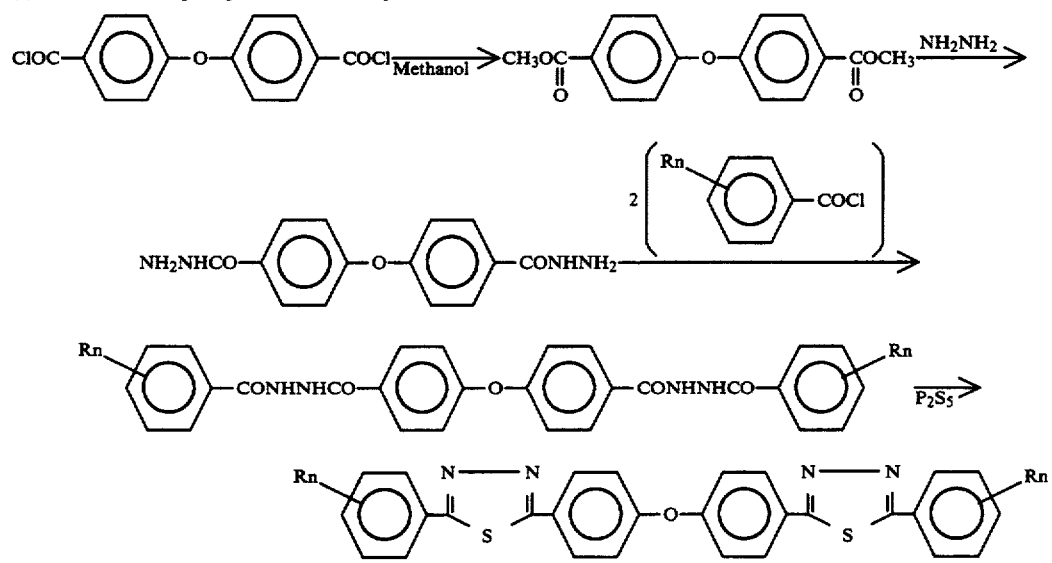

(4) Process 4 for Preparing Thiadiazole Compound C

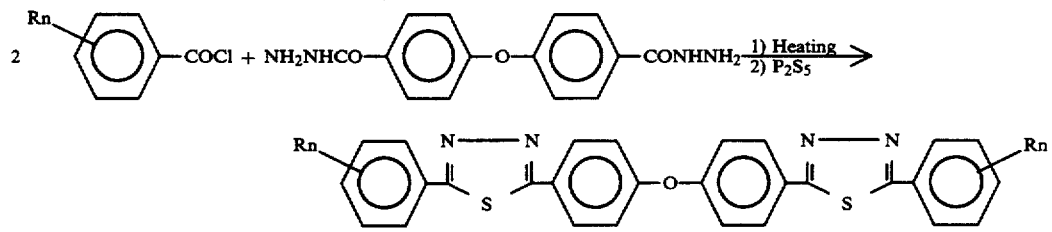

As a sulfurizing agent to be used for reaction in the above processes 1,2,3 and 4 for preparing thiadiazole compound C, $P_2S_5$ is mentioned. The reaction temperature during dehydration is 60° to 220° C., preferably 70° to 180° C., and the reaction time is 1 to 20 hours (stirring).

(5) Process for Preparing Thiadiazole Compound D

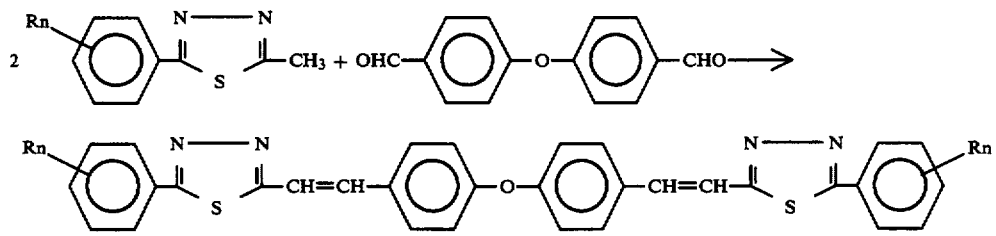

The process for preparing thiadiazole compound D represented by the above chemical formula is the same as that for preparing oxadiazole compound B. 5-aryl-2-methyl-1,3,4thiadiazole as a starting material can be prepared according to the process described in Yakugaku Zasshi 90 (1) p.95–98 (1970).

The present invention is described in greater detail with reference to Preparation Examples, Examples and Comparative Examples.

Preparation Example 1

Preparation of 4,4'-bis(5-phenyl-1,3,4-oxadiazole-2-yl)diphenylether

To 20 g of polyphosphoric acid were added 0.82 g (6.0 mmol) of benzoic hydrazide and 0.64 g (2.48 mmol) of diphenylether-4,4'-dicarboxylic acid. The mixture was heated to 140° C., stirred for 8 hours, and left to cool. Then, distilled water was added to the mixture. The resulting precipitate was filtered off under reduced pressure and suspended in distilled water. The suspension was neutralized by sodium bicarbonate, washed with distilled water and then methanol, filtered off under reduced pressure and dried.

Subsequently, the resulting powder was dissolved by heating in 20 ml of DMSO and the mixture was filtered off. The solvent was distilled away, and the resultant was washed with distilled water and then methanol, filtered off under reduced pressure, washed with hot chloroform and dried to give 0.88 g of white powder.

The NMR and MS analysis proved that the product was the desired 4,4'-bis(5-phenyl-1,3,4-oxadiazole-2-yl)diphenylether. The amount of the product was 1.92 mmol, and the yield was 77.4%.

The structural formula of the resulting 4,4'-bis(5-phenyl-1,3,4-oxadiazole-2-yl)diphenylether is shown as follows.

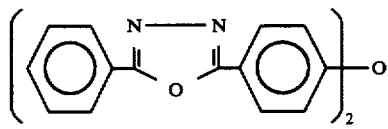

For preparing a device, the white powder obtained by further sublimation and purification was used.

Preparation Example 2

Preparation of 4,4'-bis(5-(p-diphenyl)-1,3,4-oxadiazole-2-yl)diphenylether (1) Preparation of N,N'-bis(p-diphenyl)diphenylether-4,4'dicarboxylic acid dihydrazide To 10 ml of a solution of pyridine containing 2 13 g (10 mmol) of p-phenylbenzoic hydrazide and 2 g of triethyl amine, 30 ml of a solution of pyridine containing 1.48 g (5 mmol) of diphenylether-4,4'-dicarboxylic acid dichloride was added dropwise at room temperature. The mixture was heat-refluxed for 6 hours. After the reaction, the solvent was distilled away under reduced pressure. On pouring 50 ml of distilled water, white precipitate resulted, and was filtered out. The precipitate was washed with distilled water and dried to obtain white powder, 3.0 g (4.6 mmol) of N,N'-bis(p-diphenyl)diphenylether-4,4'-dicarboxylic acid dihydrazide. The yield was 92.0%.

(2) Preparation of 4,4'-bis(5-(p-diphenyl)-1,3,4-oxadiazole-2-yl)diphenylether

To 1.03 g (1.6 mmol) of the N,N'-bis(p-diphenyl)diphenylether-4,4'-dicarboxylic acid dihydrazide obtained above was added 20 g of phosphorus pentoxide-methane-sulfonic acid (PPMA). The mixture was stirred while heating at 120° C. for 6 hours, cooled on standing and then poured into distilled water. The resulting white precipitate was filtered out, washed with distilled water to be neutralized, washed with methanol and then with hot chloroform, and dried to obtain 0.82 g of white powder. The NMR and MS analysis proved that the product was the desired 4,4'-bis(5-(p-diphenyl)-1,3,4-oxadiazole-2-yl) diphenylether. The amount of product was 1.34 mmol, and the yield was 83.8%.

The structural formula of the resulting 4,4'-bis(5-(p-diphenyl)-1,3,4-oxadiazole-2-yl)diphenylether is shown as follows.

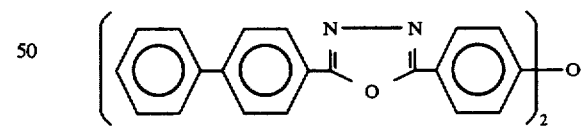

For forming a device, a white powder obtained through further sublimation and purification was used.

Preparation Example 3

Preparation of 4,4'-bis(5-(4-tert-butylphenyl)-1,3,4-oxadiazole-2-yl)diphenylether The reaction was performed in the same manner as in Preparation Example 1 except that 4-tert-butylbenzoic acid hydrazide was used in place of p-phenylbenzoic hydrazide. The results of NMR and MS analysis showed that the amount of the desired 4,4'-bis(5-(4-tert-butylphenyl)-1,3,4-oxadiazole-2-yl) diphenylether was 0.76 mmol, and the yield of it was 30.7%.

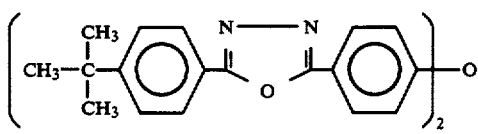

For forming a device a white powder obtained through further sublimation and purification was used.

Preparation Example 4

Preparation of 4,4'-bis[2-(5-(p-diphenyl)-1,3,4-oxadiazole-2-yl) vinyl]diphenylether (1) Preparation of 2-methyl-5-(p-phenyl)phenyl-1,3,4-oxadiazole To 6.36 g (30 mmol) of 4-phenylbenzoic hydrazide was added 15 ml of acetic anhydride, and the resulting mixture was stirred at room temperature. The resulting white crystal was washed with water and dried. Subsequently, 20 g of PPMA was added thereto and the mixture was stirred while heating at 70° C. for 4 hours. The resulting oily substance was added dropwise to 50 ml of distilled water, whereupon a white precipitate was formed. The resulting white precipitate was washed with water, dried and recrystallized from ethanol to obtain 2.1 g of white powder.

The results of the NMR and MS analysis showed that the amount of the desired 2-methyl-5-(p-phenyl)phenyl-1,3,4oxadiazole was 8.19 mmol, and the yield of it was 27.3%. (2) Preparation of 4,4'-bis[2-(5-(p-diphenyl)-1,3,4-oxadiazole-2-yl)vinyl]diphenylether In 10 ml of tetrahydrofuran (THF) was dissolved 0.6 g (2.4 mmol) of 2-methyl-5-(p-phenyl)phenyl-1,3,4-oxadiazole in a stream of argon. To the mixture, 0.32 g (2.8 mmol) of potassium tert-butoxide was added, and the resulting mixture was stirred for 30 minutes. Subsequently, to the mixture was added dropwise a solution of 0.23 g (1 mmol) of 4 4'-diformyldiphenylether dissolved in THF (10 ml) and the resultant was stirred for 6 hours.

Then, methanol was added to the mixture, which was filtered off under reduced pressure to obtain light yellow powder. The resulting powder was washed with water and then with methanol, filtered out and dried to obtain 0.34 g of white powder.

The results of NMR and MS analysis showed that the amount of the desired 4,4'-bis[2-(5-(p-diphenyl)-1,3,4-oxadiazole-2-yl) vinyl]diphenylether was 0.51 mmol, and the yield of it was 51.3%.

The structural formula of the resulting 4,4'-bis[2-(5-(p-diphenyl)-1,3,4-oxadiazole-2-yl)vinyl]diphenylether is shown as follows.

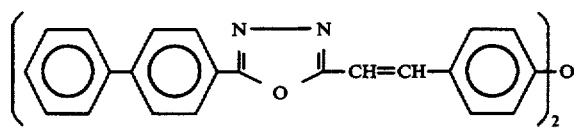

For forming a device, a white powder obtained by further sublimation and purification was used.

Preparation Example 5

Preparation of 4,4'-bis[2-(5-phenyl-1,3,4-oxadiazole-2-yl) vinyl]diphenylether

In 3 ml of DMSO was dissolved 0.68 g (4.2 mmol) of 2-methyl-5-phenyl-1,3,4-oxadiazole and 0.46 g (2 mmol) of 4,4'-diformyldiphenylether. To the resulting mixture, 1 ml of 50% aqueous sodium hydroxide solution was added. The mixture was stirred for 3 hours and then allowed to stand for 12 hours. To the resultant was added 30 ml of distilled water, and the mixture was stirred, filtered off under reduced pressure and dried to obtain 0.1 g of white powder.

The results of NMR and MS analysis showed that the amount of the desired 4,4'-bis[2-(5-phenyl-1,3,4-oxadiazole-2-yl)vinyl]diphenylether was 0.354 mmol, and the yield of it was 17.7%.

The structural formula of the resulting 4,4'-bis[2-(5-phenyl-1,3,4-oxadiazole-2-yl)vinyl]diphenylether is shown as follows.

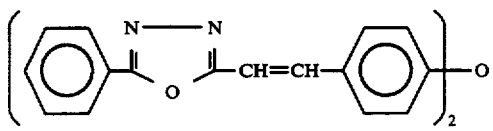

For forming a device, a white powder obtained through further sublimation and purification was used.

Preparation Example 6

Preparation of 4,4'-bis(5-(4-tert-butylphenyl)-1,3,4-oxadiazole-2-yl)diphenylmethane The reaction was performed in the same manner as in Preparation Example 1 except that 4-tert-butylbenzoic hydrazide was used in place of p-phenylbenzoic hydrazide and that diphenylmethane-4,4'-dicarboxylic acid was used in place of diphenylether-4,4'-dicarboxylic acid.

The results of NMR and MS analysis showed that the amount of the desired 4,4'-bis(5-(4-tert-butylphenyl)-1,3,4-oxadizaole-2-yl)diphenylmethane was 0.81 mmol, and the yield of it was 32.8%.

The structural formula of the resulting 4,4'-bis(5-(4-tert-butylphenyl)-1,3,4-oxadiazole-2-yl)diphenylmethane is shown as follows.

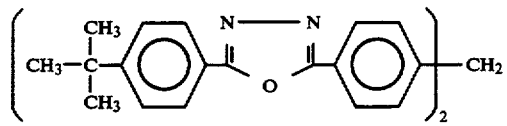

For forming a device, the white powder obtained through further sublimation and purification was used.

Preparation Example 7

Preparation of 4,4'-bis(5-(1-naphthyl)-1,3,4-oxadiazole-2-yl) diphenylether

The reaction was performed in the same manner as in Preparation Example 1 except that 1-naphthalene carboxylic acid hydrazide was used in place of p-phenylbenzoic hydrazide.

The results of NMR and MS analysis showed that amount of the desired 4,4'-bis(5-(1-naphthyl)-1,3,4-oxadiazole-2-yl) diphenylether was 0.55 mmol, and the yield of it was 22.1%.

The structural formula of the resulting 4,4'-bis(5-(1-naphthyl)-1,3,4-oxadiazole-2-yl)diphenylether is shown as follows.

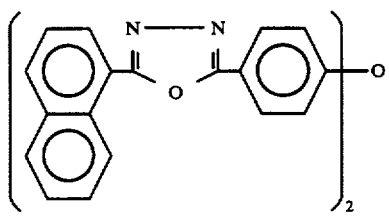

For forming a device, the white powder obtained through further sublimation and purification was used.

Preparation Example 8

Preparation of 4,4'-bis(5-(1-naphthyl)-1,3,4-thiadiazole-2-yl) diphenylether (1) Preparation of N,N'-di(1-naphthyl)diphenylether-4,4'dicarboxylic acid hydrazide To 20 ml of a solution of pyridine containing 1.86 g (10 mmol) of 1-naphthalene carboxylic acid hydrazide was added 1.48 g (5 mmol) of diphenylether-4,4'-dicarboxylic acid dichloride little by little on a water bath. The mixture was heat-refluxed for 10 hours. After the reaction, the solvent was distilled away under reduced pressure. On pouring 50 ml of distilled water, the resulting white precipitate was filtered out. The white precipitate obtained was washed with water and then with methanol, and dried to obtain 2.93 g (4.9 mmol) of white powder. The yield was 98%.

(2) Preparation of 4,4'-bis(5-(1-naphthyl)-1,3,4-thiadiazole-2yl)diphenylether

In 10 ml of pyridine was dissolved 2.39 g (4 mmol) of N,N'-di(1-naphthyl)diphenylether-4,4'-dicarboxylic acid hydrazide obtained in (1), and 2.4 g of diphosphorus pentasulfide was added thereto little by little. The resulting mixture was heat-refluxed for 12 hours. After the reaction, 4 ml of ethanol was added to the mixture, and then 80 ml of distilled water was added thereto little by little to deposit a precipitate. The mixture was neutralized by adding aqueous sodium hydroxide solution and filtered off to give 1.0 g of a light yellow solid. The results of NMR and MS analysis showed that the amount of the product was 1.7 mmol, and the yield of it was 43%.

The structural formula of the resulting 4,4'-bis(5-(1-naphthyl)-1,3,4-thiadiazole-2-yl)diphenylether is shown as follows.

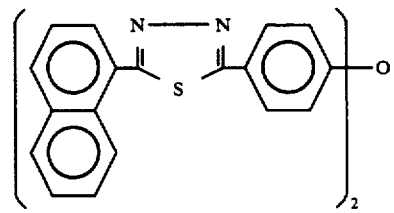

For forming a device, the light yellow powder obtained through further sublimation and purification was used.

Preparation Example 9

Preparation of 4,4'-bis(5-phenyl-1,3,4-thiadiazole-2-yl) diphenylether

To the solution of 1.37 g (10 mmol) of benzoic hydrazide dissolved in 20 ml of pyridine was added 1.48 g (5 mmol) of diphenylether-4,4'-dicarboxylic acid dichloride little by little and the mixture was heat-refluxed for 6 hours. The mixture was left to cool, and 3.0 g of diphosphorus pentasulfide was added thereto little by little while cooling on a water bath, and the mixture was heat-refluxed for 14 hours. After the reaction, 5 ml of ethanol was added thereto and then 100 ml of distilled water was added thereto little by little to deposit a precipitate. After the mixture was neutralized by adding a sodium hydroxide solution, the reaction mixture was extracted with chloroform and the solvent was distilled away to obtain an orange viscous solution. Subsequently, 5% aqueous sodium hydroxide solution was added to the solution to be dissolved, and the impurities were filtered off. The resultant was neutralized by dilute hydrochloric acid to obtain 2.19 g of light yellow powder.

The results of NMR and MS analysis showed that the amount of the desired product was 4.5 mmol, and the yield of it was 90%.

The structural formula of the resulting 4,4'-bis(5-phenyl-1,3,4-thiadiazole-2-yl)diphenylether is shown as follows.

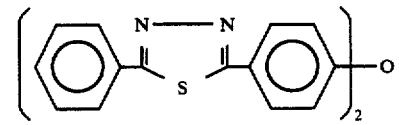

For forming a device, the light yellow powder obtained through further sublimation and purification was used.

Preparation Example 10

Preparation of 4,4'-bis(5-(p-methoxyphenyl)-1,3,4-thiadiazole-2-yl)diphenylether Reaction and separation were performed in the same manner as in Preparation Example 8 except that p-methoxybenzoic hydrazide was used in place of 1-naphthalene carboxylic acid hydrazide.

The results of NMR and MS analysis showed that the amount of desired product was 3.4 mmol, and the yield of it was 68%.

The structural formula of the resulting 4,4'-bis(5-(p-methoxyphenyl)-1,3,4-thiadiazole-2-yl)diphenylether is shown as follows.

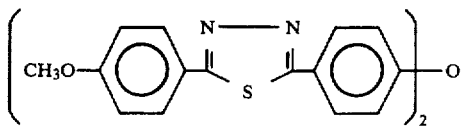

For forming a device, the light-yellow powder obtained through further sublimation and purification was used.

Preparation Example 11

Preparation of 4,4'-bis(5-(p-cyanophenyl)-1,3,4-thiadiazole-2-yl)diphenylether

Reaction and separation were performed in the same manner as in Preparation Example 8 except that p-cyanobenzoic hydrazide was used in place of 1-naphthalene carboxylic acid hydrazide.

The results of NMR and MS analysis showed that the amount of the desired product was 2.8 mmol, and the yield of it was 54%.

The structural formula of the resulting 4,4'-bis(5-(p-cyanophenyl)-1,3,4-thiadiazole-2-yl)diphenylether is shown as follows.

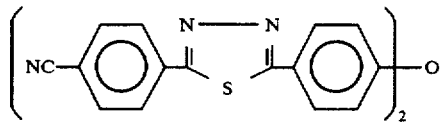

For forming a device, the light yellow powder obtained through further sublimation and purification was used.

Preparation Example 12

Preparation of 4,4'-bis(5-(m-chlorophenyl)-1,3,4-thiadiazole-2-yl)diphenylether

Reaction and separation were performed in the same manner as in preparation Example 8 except that m-chlorobenzoic hydrazide was used in place of 1-naphthalene carboxylic acid hydrazide.

The results of NMR and MS analysis showed that the amount of the desired product was 3.3 mmol, and the yield of it was 66%.

The structural formula of the resulting 4,4'-bis(5-(m-chlorophenyl)-1,3,4-thiadiazole-2-yl)diphenylether is shown as follows.

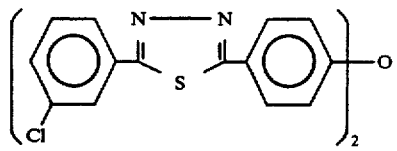

For preparing a device, the light yellow powder obtained by further sublimation and purification was used.

Preparation Example 13

Preparation of 1,1'-oxybis(p-(5-(1-naphthyl)-1,3,4-thiadiazole-2-yl)diphenyl)

(1) Preparation of 4,4'-bis(N-naphthoyl-4-hydrazynocarbonylphenyl)biphenylether

To 20 ml of a solution of pyridine containing 1.86 g (10 mmol) of 1-naphthalene carboxylic acid hydrazide was added 2.23 g (5 mmol) of 4,4'-bis(4-chlorocarbonylphenyl)biphenylether little by little at room temperature. The mixture was heat-refluxed for 16 hours. After the reaction, the solvent was distilled away under reduced pressure. On pouring 50 ml of distilled water, a white precipitate resulted. The resulting white precipitate was filtered out, and washed with water and then with methanol, and dried to give 3.43 g (4.6 mmol) of white powder. The yield was 92%.

(2) Preparation of 1,1'-oxybis(p-(5-(1-naphthyl)-1,3,4-thiadiazole-2-yl)diphenyl)

Reaction and separation were performed in the same manner as in Preparation Example 8 (2) except that 4 mmol of 4,4'-bis(N-naphthoyl-4-hydrazynocarbonylphenyl)biphenylether obtained in Preparation Example 13 (1) was used in place of N,N'-di(1-naphthyl)diphenylether-4,4'-dicarboxylic acid dihydrazide obtained in Preparation Example 8 (1).

The results of NMR and MS analysis showed that the amount of the desired product was 2.88 mmol, and the yield of it was 72%.

The structural formula of the resulting 1,1'-oxybis(p-(5-(1-naphthyl)-1,3,4-thiadiazole-2-yl)diphenyl) is shown as follows.

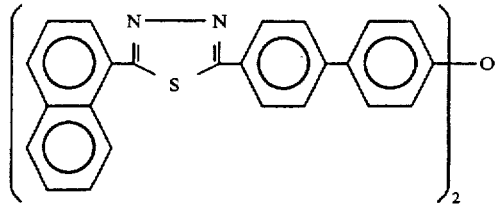

For forming a device, the light yellow powder obtained through further sublimation and purification was used.

Example 1

A glass substrate provided with an ITO transparent electrode 100 nm thick (25×75×1.1 mm, produced by HOYA Co., Ltd.) was used as a transparent supporting substrate, and was ultrasonically washed with isopropyl alcohol for 30 minutes, and further dipped and washed. Said transparent supporting substrate was dried with dry nitrogen gas and attached to the substrate holder of the commercially available vapor deposition system. 200 mg of N,N'-diphenyl-N,N'-bis(3-methylphenyl)(1,1,-biphenyl)-4,4'-diamine (TPDA) was placed in an electrically-heated boat made of molybdenum. In another electrically-heated boat made of molybdenum, 200 mg of 4,4-bis[2,2-di(4-tert-butylphenyl)-vinyl]biphenyl (DTBPVBi) was placed, and further in another electrically-heated boat made of molybdenum was placed 200 mg of 4,4-bis(5-phenyl-1,3,4-oxadiazole-2-yl)diphenylether (Preparation Example 1:DPOD- BiE). The above three electrically-heated boats were attached to the vapor deposition system.

First, the pressure of the vacuum chamber was decreased to $4\times10^{-4}$ Pa, then an electric current was passed through the above electrically-heated boat containing TPDA, which was heated to 220° C. The vapor deposition was performed on the transparent supporting substrate at the rate of 0.1 to 0.7 nm/sec to produce a hole injecting layer with a film thickness of 60 nm.

Subsequently, an electric current was passed through the above electrically-heated boat containing DTBPVBi, which was heated to 315° C. The vapor deposition was performed on the above hole injecting layer at the rate of 0.1 to 0.3 nm/sec to produce a light emitting layer with a film thickness of 30 nm.

Moreover, an electric current was passed through the above electrically-heated boat containing DPODBiE, which was heated to 290° C. The vapor deposition was performed on the above light emitting layer at the rate of 0.1 nm/sec to produce an electron injecting layer with a film thickness of 20 nm.

The temperature of the substrate was room temperature during the vapor deposition.

Subsequently, the vacuum chamber was opened and a stainless steel mask was placed on the electron injecting layer. 3 g of magnesium ribbon was placed in the electrically-heated boat made of molybdenum and indium wire was placed in the crucible of an electron beam vapor deposition system. After the pressure of the vacuum chamber was reduced again to $2\times10^{-4}$ Pa, an electric current was passed through the boat containing magnesium ribbon, which was vapor deposited at the rate of 2 to 3 nm/sec, and at the same time indium wire was heated by the electron beam and vapor deposited at the rate of 0.1 to 0.2 nm/sec to prepare a counter electrode comprising a mixture of magnesium and indium, whereupon the desired organic EL device was produced.

Upon applying a DC voltage of 12.5 V between the ITO electrode being an anode and the counter electrode comprising a mixture of magnesium and indium being a cathode, an electric current with a current density of 160 mA/cm$^2$ was passed and an emission of blue light was obtained. The maximum wavelength was 475 nm, the brightness was 1200 cd/m$^2$, and the luminous efficiency of the light was 0.19 lm/W. 24 hours after an electric current was passed, neither peeling-off nor milky turbidity on the surface of the electrodes occurred, and an emission of blue light was still observed.

Examples 2 to 6

Organic EL devices were prepared and evaluated in the same manner as in Example 1 except that the compounds described in Table 1 were used in place of DPODBiE and the temperatures of the electrically-heated boats during vapor deposition were changed as described in Table 1. The results are shown in Table 1.

TABLE 1

| | Oxadiazole Compound | Temperature of Boat (°C) | Applied Voltage (V) | Current Density (mA/cm$^2$) | Brightness (cd/m$^2$) | Luminous Efficiency (lm/W) | Peak Wavelength (nm) | Adhesion of Electrode[1] | Lifetime[2] (hours) |
|---|---|---|---|---|---|---|---|---|---|
| Example 2 | Preparation Ex. 2 | 325 | 15 | 105 | 2040 | 0.41 | 477 | Good | over 50 hours |
| Example 3 | Preparation Ex. 3 | 287 | 15 | 82 | 1400 | 0.36 | 477 | Good | over 50 hours |
| Example 4 | Preparation Ex. 4 | 328 | 12.5 | 87 | 820 | 0.24 | 475 | Good | over 50 hours |
| Example 5 | Preparation Ex. 5 | 316 | 12.5 | 105 | 1020 | 0.24 | 473 | Good | over 24 hours |
| Example 6 | Preparation Ex. 6 | 280 | 12.5 | 88 | 1240 | 0.35 | 475 | Good | over 24 hours |

[1] After the formation of a device, an electric current was passed to continue light emission. When the light was about to disappear, the surface of the electrode was visually observed. No milky turbidity on the electrode is taken as good. Milky turbidity is taken as no good.

[2] After the formation of a device, an electric current was passed to continue light emission. The moment when the light emission was not visually observed is taken as the end of its lifetime.

EXAMPLE 7

An organic EL device was formed in the same manner as in Example 1 except that tris(8-hydroxyquinoline)aluminum was used in place of DTBPVBi and 4,4'-bis[5-(1-naphthyl)-1,3,4-oxadiazole-2-yl]diphenylether was used in place of DPODBiE.

Upon applying a DC voltage of 15 V between the ITO electrode being an anode and the counter electrode comprising a mixture of magnesium and indium being a cathode, an electric current with a current density of 77 mA/cm$^2$ was passed and an emission of green light was obtained. The maximum wavelength was 510 nm, the brightness was 1390 cd/m$^2$, and the luminous efficiency of the light was 0.38 lm/W. 24 hours after an electric current was passed, there was neither peeling-off nor milky turbidity on the surface of the electrodes, and an emission of green light was still observed.

EXAMPLE 8

An organic EL device was prepared in the same manner as in Example 1 except that the vapor deposition of TPDA was omitted, 4,4'-bis(2,2-diphenylvinyl)-biphenyl was used in place of DTBPVBi and the temperature of the electrically-heated boat during the vapor deposition was 240° C.

Upon applying a DC voltage of 15 V between the ITO electrode being an anode and the counter electrode comprising a mixture of magnesium and indium being a cathode, an electric current with a magnesium and indium being a cathode, an electric current with a current density of 112 mA/cm$^2$ was passed and an emission of blue light was obtained. The maximum wavelength was 475 nm, the brightness was 1680 cd/m$^2$, and the luminous efficiency of the light was 0.31 lm/W. 40 hours after an electric current was passed, there was neither peeling-off nor milky turbidity on the surface of the electrodes, and an emission of blue light was still observed.

EXAMPLES 9 to 14

Organic EL devices were formed and evaluated in the same manner as in Example 1 except that thiadiazole compounds described in Table 2 were used in place of DPOBiE of Preparation Example 1 and temperatures and voltages during the vapor deposition were changed to those described in Table 2. The results are shown in Table 2.

TABLE 2

|  | Thiadiazole Compound | Temperature of Boat (°C.) | Applied Voltage (V) | Current Density (mA/cm²) | Brightness (cd/m²) | Luminous Efficiency (lm/W) | Peak Wavelength (nm) | Adhesion of Electrode | Lifetime (hours) |
| --- | --- | --- | --- | --- | --- | --- | --- | --- | --- |
| Example 9 | Preparation Ex. 8 | 327 | 10 | 42 | 1380 | 1.03 | 475 | Good | over 50 hours |
| Example 10 | Preparation Ex. 9 | 292 | 10 | 68 | 1880 | 0.87 | 475 | Good | over 50 hours |
| Example 11 | Preparation Ex. 10 | 283 | 10 | 53 | 840 | 0.39 | 477 | Good | over 50 hours |
| Example 12 | Preparation Ex. 11 | 311 | 10 | 76 | 1050 | 0.31 | 475 | Good | over 24 hours |
| Example 13 | Preparation Ex. 12 | 266 | 12.5 | 43 | 990 | 0.27 | 476 | Good | over 24 hours |
| Example 14 | Preparation Ex. 13 | 330 | 12.5 | 44 | 1610 | 0.77 | 477 | Good | over 50 hours |

Comparative Example 1

An organic EL device was prepared in the same manner as in Example 6 except that the commercially available 2-(4-biphenyl)-5-(4-tert-butylphenyl)-1,3,4-oxadizaole was used in place of DPODBiE and the temperature of the heated boat during vapor deposition was 165° C.

Upon applying a DC voltage of 15 V between the ITO electrode being an anode and the counter electrode comprising a mixture of magnesium and indium being a cathode, an electric current with a current density of 90 mA/cm² was passed and an emission of blue light was obtained. The maximum wavelength was 475 rim, the brightness was 500 cd/m², and the luminous efficiency of the light was 0.1 lm/W. After an electric current was passed, there was no peeling-off on the surface of the electrodes. The light completely disappeared after 2.5 hours.

Comparative Example 2

An organic EL device was prepared in the same manner as in Example 1 except that 4,4'-bis[5-(4-tert-butylphenyl)-1,3,4-oxadiazole-2-yl]diphenyl was used in place of DPDBiE.

Upon applying a DC voltage of 15 V between the ITO electrode being an anode and the counter electrode comprising a mixture of magnesium and indium being a cathode, an electric current with a current density of 100 mA/cm² was passed and an emission of bluish green light was obtained. The maximum wavelength of the emission was 487 nm, the brightness was 650 cd/m², and the luminous efficiency of the light was 0.14 lm/W. The light completely disappeared 8.5 hours after an electric current was passed.

When said compound was used for an electron injecting layer, an exciplex was formed and the desired emission of blue light in the organic EL device of the present invention was not obtained.

INDUSTRIAL AVAILABILITY

As described above, the organic EL device of the present invention has a high brightness, a high luminous efficiency and a long lifetime.

Accordingly, the organic EL device of the present invention can be effectively utilized in chemical industry.

What is claimed is:

1. In an organic electroluminescence device, the improvement comprising the device containing a compound represented by the formula:

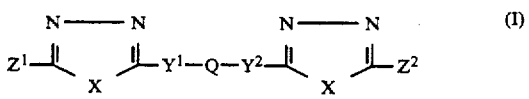

(I)

wherein $Z^1$ and $Z^2$ are each an unsubstituted aromatic group or an aromatic group being substituted with $C_{1-5}$ alkyl groups, $C_{1-5}$ alkyloxy groups, cyano groups, chlorines, bromines or fluorines; $Y^1$ and $Y^2$ are each an unsubstituted aromatic group or an aromatic group being substituted with $C_{1-5}$ alkyl groups; Z is —O—, —CH$_2$—, —CH$_2$—CH$_2$—, or —C(CH$_3$)$_2$—; and X is —O— or —S—.

2. In an organic electroluminescence device, the improvement comprising the device containing a compound represented by the formula:

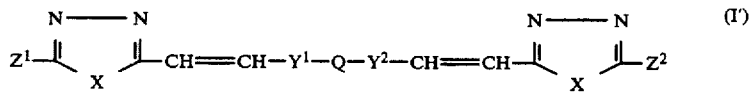

(I')

wherein $Z^1$ and $Z^2$ are each an unsubstituted aromatic group or an aromatic group being substituted with $C_{1-5}$ alkyl groups, $C_{1-5}$ alkyloxy groups, cyano groups, chlorines, bromines or fluorines; $Y^1$ and $Y^2$ are each an unsubstituted aromatic group or an aromatic group being substituted with $C_{1-5}$ alkyl groups; Q is —O—, —CH$_2$—, —CH$_2$—CH$_2$—, or —C(CH$_3$)$_2$—; and X is —O— or —S—.

3. The organic electroluminescence device according to claim 1, wherein the compound is sandwiched between a pair of electrodes.

4. The organic electroluminescence device according to claim 3, wherein the device is in the form of a laminate comprising in the following order: an anode, a hole injecting layer, a light emitting layer, an electron injecting layer and a cathode, said light emitting layer or said electron injecting layer comprising said compound.

5. The organic electroluminescence device according to claim 3, wherein the device is in the form of a laminate comprising in the following order: an anode, a light emitting layer, an electron injecting layer and a cathode, said light emitting layer or said electron injecting layer comprising said compound.

6. The organic electroluminescence device according to claim 2, wherein the compound is sandwiched between a pair of electrodes.

7. The organic electroluminescence device according to claim 6, wherein the device is in the form of a laminate comprising in the following order: an anode, a hole injecting layer, a light emitting layer, an electron injecting layer and a cathode, said light emitting layer or said electron injecting layer comprising said compound.

8. The organic electroluminescence device according to claim 6, wherein the device is in the form of a laminate comprising in the following order: an anode, a light emitting layer, an electron injecting layer and a cathode, said light emitting layer or said electron injecting layer comprising said compound.

9. The organic electroluminescence device according to claim 1, wherein the device comprises an electron injecting layer which comprises said compound.

10. The organic electroluminescence device, according to claim 2 wherein the device comprises an electron injecting layer which comprises said compound.

11. The organic electroluminescence device according to claim 1, wherein $Z^1$ and $Z^2$ are each selected from the group consisting of

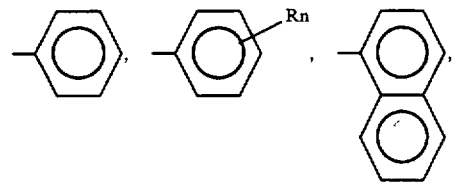

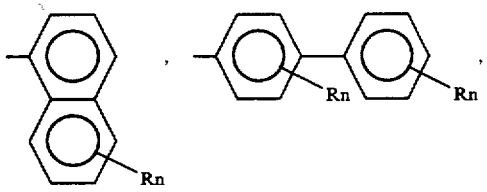

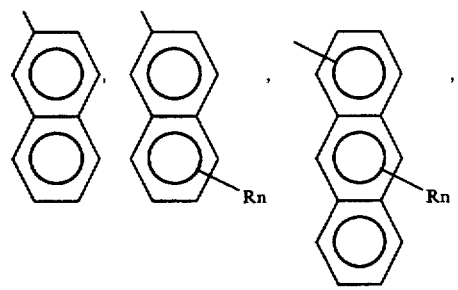

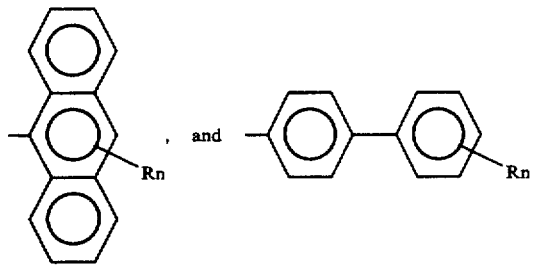

wherein R is a methyl group, an ethyl group, an n-propyl group, an i-propyl group, an n-butyl group, an i-butyl group, a sec-butyl group, a tert-butyl group, an isopentyl group, a t-pentyl group, a neopentyl group, a cyano group, a methoxy group, an ethoxy group, an n-propoxy group, an i-propoxy group, an n-butoxy group, an i-butoxy group, a sec-butoxy group, a tert-butoxy group, an isopentoxy group, a neopentoxy group, chlorine bromine or fluorine; and n is 1 to 5.

12. The organic electroluminescence device according to claim 11, wherein $Y^1$ and $Y^2$ are each selected from the group consisting of

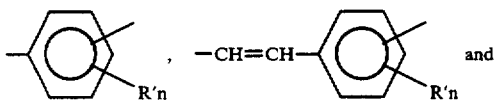

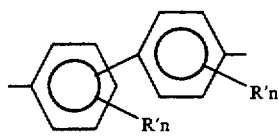

wherein R' is selected from the group consisting of a methyl group, an ethyl group, an n-propyl group, an i-propyl group, an n-butyl group, an i-butyl group, a sec-butyl group, a tert-butyl group, an isopentyl group, a t-pentyl group, and a neopentyl group; and n is 1 to 4.

13. The organic electroluminescence device according to claim 2, wherein $Z^1$ and $Z^2$ are each selected from the group consisting of

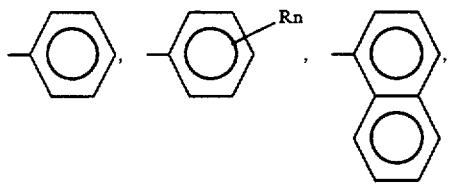

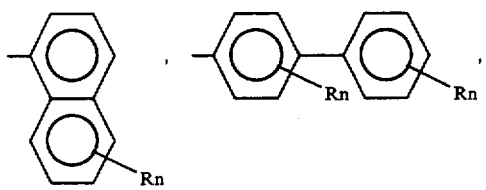

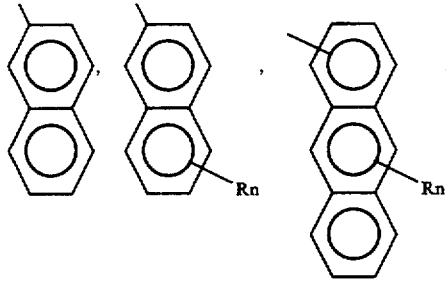

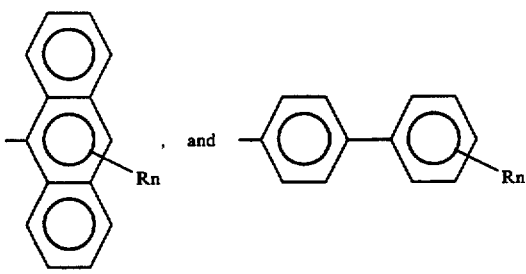

wherein R is a methyl group, an ethyl group, an n-propyl group, an i-propyl group, an n-butyl group, an i-butyl group, a sec-butyl group, a tert-butyl group, an isopentyl group, a t-pentyl group, a neopentyl group, a cyano group, a methoxy group, an ethoxy group, an n-propoxy group, an i-propoxy group, an n-butoxy group, an i-butoxy group, a sec-butoxy group, a tert-butoxy group, an isopentoxy group, a neopentoxy group, chlorine, bromine or fluorine; and n is 1 to 5.

14. The organic electroluminescence device according to claim 13, wherein $Y^1$ and $Y^2$ are each selected from the group consisting of

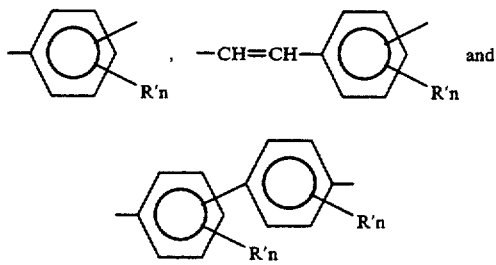

wherein R' is selected from the group consisting of a methyl group, an ethyl group, an n-propyl group, an i-propyl group, an n-butyl group, an i-butyl group, a sec-butyl group, a tert-butyl group, an isopentyl group, a t-pentyl group, and a neopentyl group; and n is 1 to 4.

15. The organic electroluminescence device according to claim 1, wherein X is S.

16. The organic electroluminescence device according to claim 2, wherein X is S.

17. An electroluminescence device comprising an oxadiazole compound which sandwiched between a pair of electrodes, said compound being selected from the group consisting of 4,4'-bis (5-phenyl-1,3,4-oxadiazole-2-yl)diphenylether, 4,4'-bis(5-(p-diphenyl)-1,3,4-oxadiazole-2-yl)diphenylether, 4,4'-bis(5-(4-tert-butylphenyl)-1,3,4-oxadiazole-2-yl)diphenylether, 4,4'-bis[2-(5-(p-diphenyl)-1,3,4-oxadiazole-2-yl)vinyl]diphenylether, 4,4'-bis[2-(5-phenyl-1,3,4-oxadiazole-2-yl)vinyl]diphenylether, 4,4'bis(5-(4-tert-butylphenyl)-1,3,4-oxadiazole-2-yl)diphenylmethane, 4,4'-bis(5-(1-naphthyl)-1,3,4-oxadiazole-2-yl)diphenylether, 4,4'-bis[5-(2-naphthyl)-1,3,4-oxadiazole-2-yl]diphenylether, 4,4'-bis[5-(4-cyanophenyl)-1,3,4-oxadiazole-2-yl]diphenylether, 1,1'-oxybis[p-(5-phenyl-1,3,4-oxadiazole-2-yl)diphenyl],1,1'-oxybis[p-(5-(4-tert-butylphenyl)-1,-3,4-oxadiazole-2-yl)diphenyl],1,1'-oxybis[p-(5-(p-diphenyl)-1,3,4-oxadiazole-2-yl)diphenyl],1,1'-oxybis[p-(5-(1-napthyl)-1,3,4-oxadiazole-2yl)diphenyl], and 1,1'-oxybis[p-(5-(2-naphthyl)-1,3,4-oxadiazole-2yl)diphenyl].

18. An electroluminescence device comprising a thiadiazole compound which is sandwiched between a pair of electrodes, said compound being selected from the group consisting of 4,4'-bis(5-phenyl-1,3,4-thiadiazole-2-yl)diphenylether, 4,4'-bis[5-(p-diphenyl)-1,3,4-thiadiazole-2-yl]diphenylether, 4,4'-bis[5-(4-tert-butylphenyl)-1,3,4-thiadiazole-2-yl]diphenylether, 4,4'-bis[5-(4-cyanophenyl)-1,3,4-thiadiazole-2yl]diphenylether, 4,4'-bis[5-chlorophenyl)-1,3,4-thiadiazole-2yl]diphenylether, 4,4'-bis[5-(p-methoxyphenyl)-1,3,4-thiadiazole-2-yl]diphenylether, 4,4'-bis[5-(4-tert-butoxyphenyl)-1,3,4-thiadiazole-2yl]diphenylether, 4,4'-bis[5-(1-naphthyl)-1,3,4-thiadiazole-2yl]diphenylether, 4,4'-bis[5-(2-naphthyl)-1,3,4-thiadiazole-2yl]diphenylether, 4,4'bis[2-(5-phenyl-1,3,4-thiadiazole-2-yl)vinyl]diphenylether, 4,4'-bis[2-(5-(p-diphenyl)-1,3,4-thiadiazole-2-yl)vinyl]diphenylether, 1,1'-oxybis[p-(5-(4-tert-butylphenyl)--1,3,4-thiadiazole-2yl)diphenyl], 1,1'-oxybis[p-(5-(p-diphenyl)-1,3,4-thiadiazole-2-yl)diphenyl],and 1,1'-oxybis[p-(5-(1-naphthyl)-1,3,4-thiadiazole-2yl)diphenyl].

19. The electroluminescence device according to claim 17, wherein said oxadizole compound is selected from the group consisting of 4,4'-bis(5-phenyl-1,3,4-oxadiazole-2-yl)diphenylether, 4,4'-bis(5-(p-diphenyl)-1,3,4-oxadiazole-2-yl)diphenylether, 4,4'-bis(5-(4-tert-butylphenyl)-1,3,4-oxadiazole-2-yl)diphenylether, 4,4'-bis[2-(5-(p-diphenyl)-1,3,4-oxadiazole-2yl)vinyl]diphenylether, 4,4'-bis[2-(5-phenyl-1,3,4-oxadiazole-2yl)vinyl]diphenylether, 4,4'-bis(5-(4-tert-butylphenyl)-1,3,4-oxadiazole-2yl)diphenylmethane and 4,4'-bis(5-(1-naphthyl)-1,3,4-oxadiazole-2yl)diphenylether.

20. The electroluminescence device according to claim 18, wherein said thiadiazole compound is selected from the group consisting of 4,4'-bis(5-(1-naphthyl)-1,3,4-thiadiazole-2yl)diphenylether, 4,4'-bis(5-phenyl-1,3,4-thiadiazole-2-yl)diphenylether, 4,4'-bis(5-(p-methoxyphenyl)-1,3,4-thiadiazole-2-yl)diphenylether, 4,4'-bis(5-(4-cyanophenyl)-1,3,4-thiadiazole-2-yl)diphenylether, 4,4'-bis(5-(m-chlorophenyl)-1,3,4-thiadiazole-2yl)diphenylether and 1,1'-oxybis(p-(5-(1-naphthyl)-1,3,4-thiadiazole-2-yl)diphenyl.

* * * * *